United States Patent
Friddell

(10) Patent No.: US 8,502,590 B2
(45) Date of Patent: Aug. 6, 2013

(54) SYSTEM AND METHOD OF CONTROLLING DEVICES OPERATING WITHIN DIFFERENT VOLTAGE RANGES

(75) Inventor: Thomas H. Friddell, Kent, WA (US)

(73) Assignee: The Boeing Company, Chicago, IL (US)

( * ) Notice: Subject to any disclaimer, the term of this patent is extended or adjusted under 35 U.S.C. 154(b) by 505 days.

(21) Appl. No.: 12/636,875

(22) Filed: Dec. 14, 2009

(65) Prior Publication Data

US 2011/0169543 A1    Jul. 14, 2011

(51) Int. Cl.
*H03L 5/00* (2006.01)

(52) U.S. Cl.
USPC ............................................. 327/333

(58) Field of Classification Search
None
See application file for complete search history.

(56) References Cited

U.S. PATENT DOCUMENTS

| | | | |
|---|---|---|---|
| 4,626,706 A | 12/1986 | Allen et al. | |
| 5,412,234 A | 5/1995 | Schoofs et al. | |
| 6,060,946 A * | 5/2000 | Harima et al. | 327/551 |
| 6,107,836 A * | 8/2000 | Kawahara et al. | 326/102 |
| 6,667,648 B2 * | 12/2003 | Stout et al. | 327/333 |
| 6,720,673 B2 | 4/2004 | Blanco et al. | |
| 6,792,582 B1 | 9/2004 | Cohn et al. | |
| 6,986,116 B2 | 1/2006 | Fry et al. | |
| 7,000,214 B2 | 2/2006 | Iadanza et al. | |
| 7,091,574 B2 | 8/2006 | Correale, Jr. | |
| 7,131,074 B2 * | 10/2006 | Bednar et al. | 326/81 |
| 7,215,188 B2 * | 5/2007 | Ramaraju et al. | 327/544 |
| 7,259,590 B1 * | 8/2007 | Anderson et al. | 326/81 |
| 7,296,251 B2 | 11/2007 | Dhanwada et al. | |
| 7,639,065 B2 * | 12/2009 | Miyazaki | 327/530 |
| 8,120,410 B2 * | 2/2012 | Meijer et al. | 327/534 |
| 2007/0047364 A1 | 3/2007 | Chuang et al. | |

FOREIGN PATENT DOCUMENTS

| | | |
|---|---|---|
| WO | WO 2004 102623 A2 | 11/2004 |
| WO | WO 2005 125012 A1 | 12/2005 |

OTHER PUBLICATIONS

International Search Report and Written Opinion of the International Searching Authority, International Application No. PCT/US2010/058938, European Patent Office; Apr. 14, 2011, (12 pgs).

* cited by examiner

*Primary Examiner* — Lincoln Donovan
*Assistant Examiner* — Khareem E Almo
(74) *Attorney, Agent, or Firm* — Toler Law Group, P.C.

(57) ABSTRACT

Semiconductor devices, systems, and methods are disclosed to facilitate power management. A semiconductor device includes a first voltage island configured to operate within a first voltage range, where the first voltage range has a first midpoint. A second voltage island of the semiconductor device is configured to operate within a second voltage range, where the second voltage range has a second midpoint. The first voltage range is different than the second voltage range, and the first midpoint is substantially equal to the second midpoint.

30 Claims, 7 Drawing Sheets

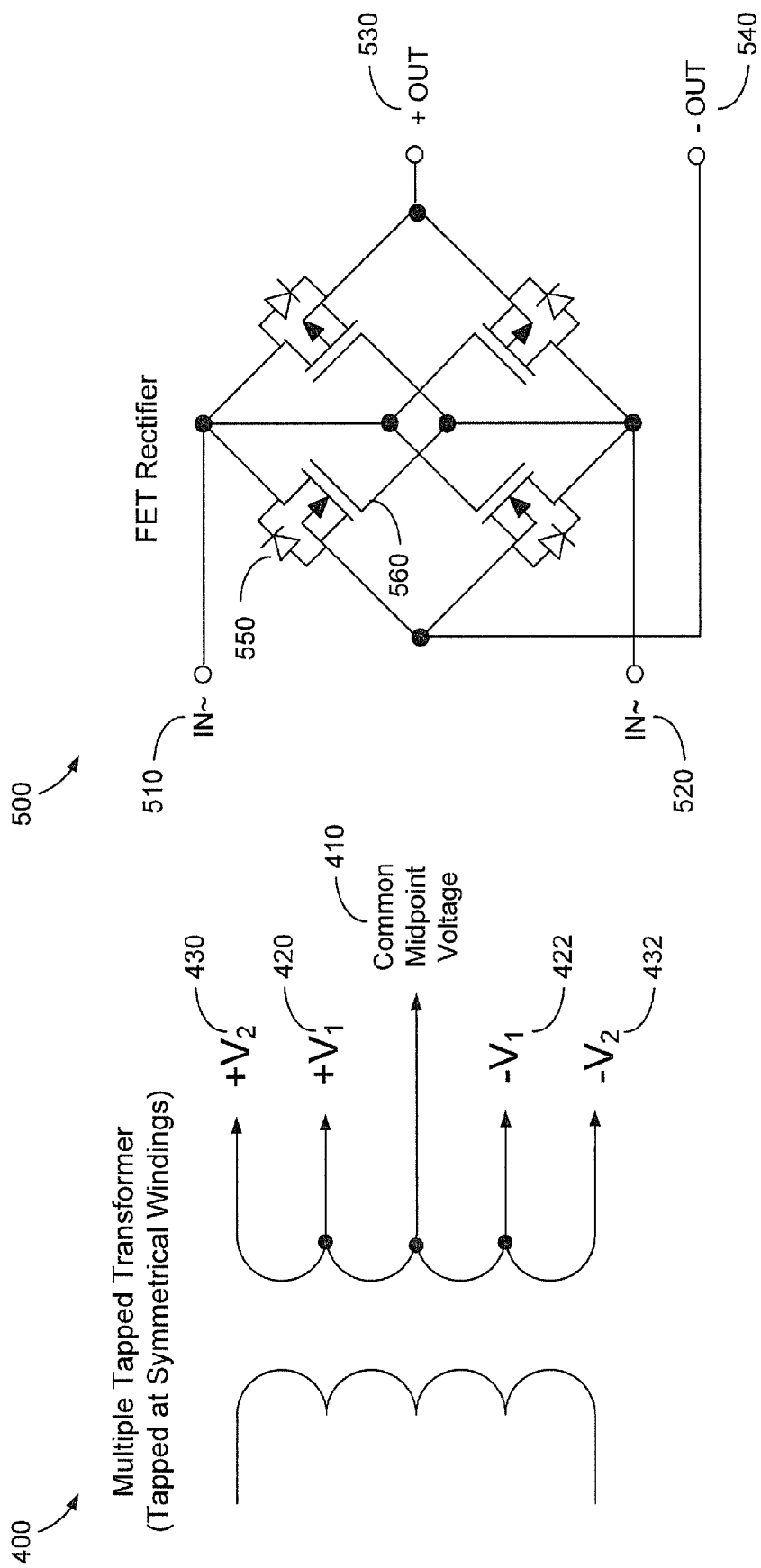

SYSTEM AND METHOD OF CONTROLLING DEVICES OPERATING WITHIN DIFFERENT VOLTAGE RANGES

STATEMENT OF GOVERNMENT RIGHTS

The disclosure was made with Government support under contract number FA8750-04-C-0007 awarded by the United States Air Force. The Government has certain rights in this disclosure.

FIELD OF THE DISCLOSURE

The present disclosure is generally related to facilitating communication of digital signals between devices operating within different voltage ranges, for example, as a result of using power management.

BACKGROUND

Operating electronic devices at a reduced power level may yield benefits such as reduced current leakage, reduced dynamic energy, extended battery life, and reduced heat generation.

System-on-chip devices may reap the benefits of selective power management by associating devices with different power domains called "voltage islands" or "power islands" that receive different voltage levels even within a same physical device. However, a potential problem may exist when a first voltage island operating at a first voltage level provides a signal to a second voltage island operating at a higher voltage level. A first voltage threshold used to differentiate between a high output signal (e.g., logic "1") and a low output signal (e.g., logic "0") for circuits within the first voltage island may be below a second voltage threshold for circuits within the second voltage island. As a result, a high output signal (e.g., logic "1") of the circuits within the first voltage island may be below the second voltage threshold, and the signal may be misinterpreted as a low output signal (e.g., logic "0") by the circuits within the second voltage island.

To facilitate communication between differently powered voltage islands, voltage level translators may be used to amplify output signals of circuits of voltage islands operating at a reduced power to expected input levels of circuits operating at a higher power. Voltage level translators, however, may consume appreciable power in amplifying signals, and voltage translation of signals may result in signal latency. Further, having to rely on voltage level translators between voltage islands may limit the granularity to which the voltage islands are partitioned because of the additional power overhead associated with level translators. There is therefore a need to enable voltage islands that operate at different voltage levels to efficiently and accurately communicate with one another.

SUMMARY

Embodiments disclosed herein include semiconductor devices, systems, and methods for enabling devices operating at different voltage ranges or voltage islands operating within different voltage ranges to communicate with one another. In one embodiment, voltage islands that potentially operate within different voltage ranges between a positive supply voltage and a negative supply voltage are configured such that the different voltage ranges are centered around a common midpoint. Thus, even if changes in power levels result in a diminished swing in output values, logic input thresholds are near the common midpoint permit correct interpretation of high and low output values. In addition, a register subsystem may be employed between voltage islands to receive an input signal generated by a voltage island operating within a first voltage range and, once the signal is stored, to change the voltage level to translate the stored signal to a second power level.

In a particular illustrative embodiment, a semiconductor device includes a first voltage island configured to operate within a first voltage range, where the first voltage range has a first midpoint. A second voltage island within the system on chip device is configured to operate within a second voltage range, where the second voltage range has a second midpoint. The first voltage range is different than the second voltage range, and the first midpoint is substantially equal to the second midpoint.

In another particular illustrative embodiment, a first device operates at a first voltage range between a first positive supply voltage and a first negative supply voltage. The first voltage range is centered around a first voltage midpoint. A second device operates at a second voltage range between a second positive supply voltage and a second negative supply voltage. The second voltage range is centered around a second voltage midpoint. The first voltage range is different than the second voltage range and the first voltage midpoint is substantially equal to the second voltage midpoint.

In still another particular illustrative embodiment of a method, a first signal is received within a first voltage range. The first signal represents a data value. The first signal is stored in a register operating within the first voltage range. After storing the first signal, the register is controlled to selectively change from operating within the first voltage range to operating within a second voltage range where the second voltage range is different than the first voltage range. A second signal is output from the register. The second signal represents the data value of the first signal and is within the second voltage range.

The features, functions, and advantages that have been described can be achieved independently in various embodiments or may be combined in yet other embodiments, further details of which are disclosed with reference to the following description and drawings.

BRIEF DESCRIPTION OF THE DRAWINGS

FIG. 4 is a diagram representing a multiple-tapped transformer that may be used by the system of FIG. 2;

FIG. 5 is a schematic diagram of a field effect transistor (FET) rectifier that may be used in voltage regulators such as the tracking voltage regulators of FIG. 2;

DETAILED DESCRIPTION

Particular illustrative embodiments of methods, systems, and subsystems facilitate power management by enabling systems to operate within different voltage ranges while correctly interpreting logic levels of signals communicated between devices or between voltage islands. For example, voltage islands incorporating a plurality of circuit elements may operate in different voltage ranges that are centered around a common midpoint. As a result, despite operating within different voltage ranges, signals between the voltage islands may be differentiated according to a voltage threshold at or near the common midpoint. In addition, a register subsystem may be used to translate a first signal within a first voltage range to a second signal within the second voltage range without using voltage translators.

Figure 1:
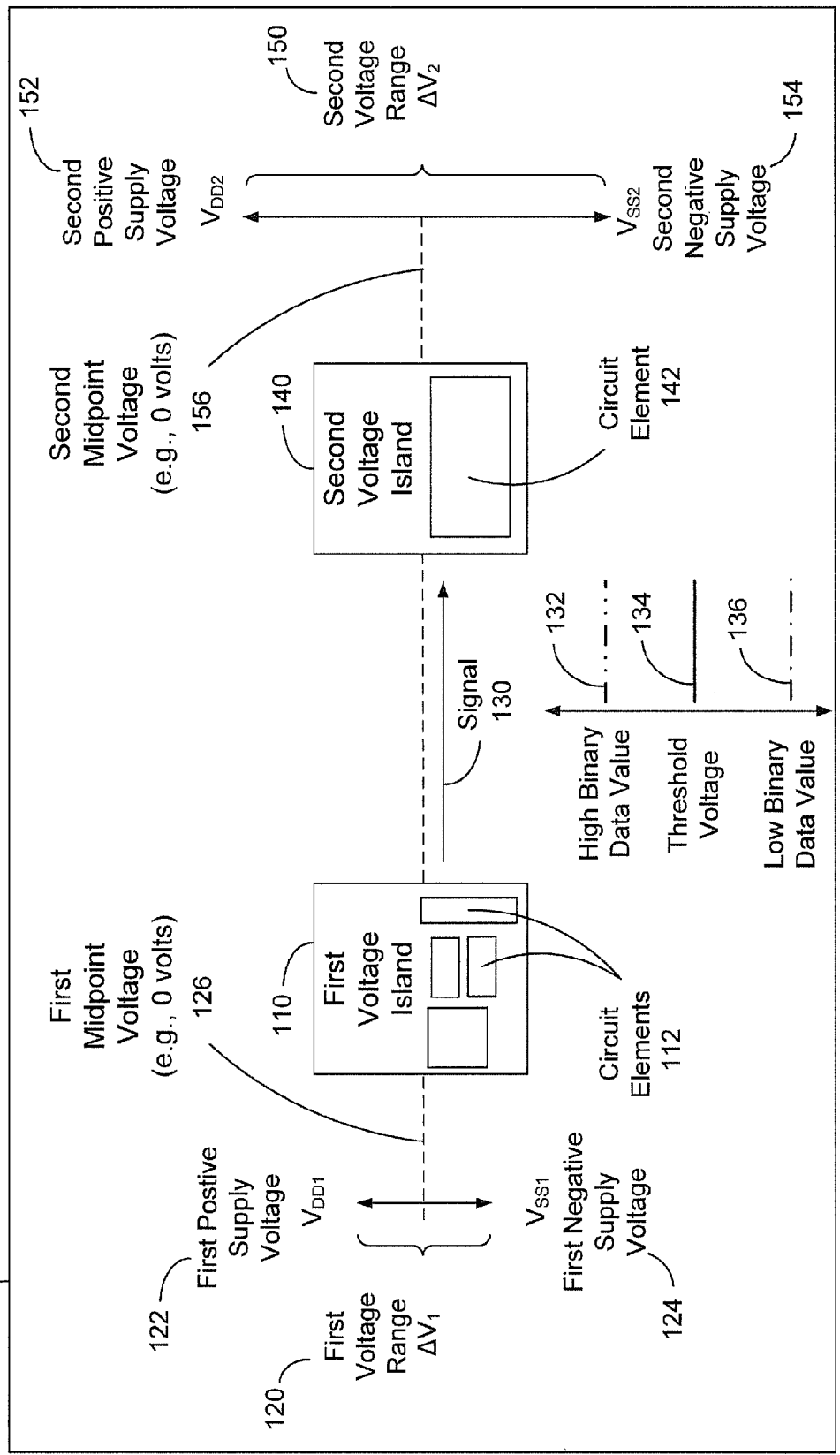
FIG. 1 is a block diagram of a system on chip (SOC) device including voltage islands operating within different voltage ranges centered around a common midpoint.

FIG. 1 is a block diagram of a system on chip (SOC) device 100 including representative voltage islands 110 and 140 operating within different voltage ranges 120 and 150, respectively, that are centered around a common midpoint. The system on chip device 100 may include a semiconductor device that is fabricated to include a plurality of circuit elements grouped into a plurality of voltage islands, such as the first voltage island 110 and the second voltage island 140. The first voltage island 110 receives a first positive supply voltage $V_{DD1}$ 122 and a first negative supply voltage $V_{SS1}$ 124 to define the first voltage range $\Delta V_1$ 120 in which the first voltage island 110 is configured to operate. The first voltage island 110 includes one or more circuit elements 112 that operate within the first voltage range $\Delta V_1$ 120 to perform one or more functions. The second voltage island 140 receives a first positive supply voltage $V_{DD2}$ 152 and a first negative supply voltage $V_{SS2}$ 154 to define the second voltage range $\Delta V_2$ 150 in which the second voltage island 140 is configured to operate. The second voltage island 140 includes a circuit element 142, or a plurality of circuit elements (not shown in FIG. 1) to perform one or more additional functions, such as functions that may be based on a signal 130 output by the first voltage island 110 to the second voltage island 140.

The signal 130 may include one of a pair of binary values (e.g., logic "1" and logic "0"), such as a high binary data value 132 (e.g., logic "1") above a threshold voltage 134 or a low binary value 136 (e.g., logic "0") below the threshold voltage 136. To facilitate the second voltage island 140 being able to correctly interpret the data value represented by the signal 130, a first midpoint voltage 126 of the first voltage range $\Delta V_1$ 120 and a second midpoint voltage 156 of the second voltage range $\Delta V_2$ 150 are set to a common midpoint voltage. The threshold voltages recognized by the voltage islands 110 and 140 may be relatively close to the midpoint voltages 126, and 156, respectively, or, at least, the threshold voltages may be closer to the midpoint voltages 126 and 156 than to extremes of the voltage ranges 120 and 150. Thus, substantially equating the common midpoint voltages 126 and 156 may enable the second voltage island 140 to correctly interpret the data value represented by the signal 130 output by the first voltage island 110.

In certain conventional systems that do not use a common midpoint, the first positive supply voltage $V_{DD1}$ 122 may be +1.0 V and the first negative supply voltage $V_{SS1}$ 124 may be 0 V, and the second positive supply voltage $V_{DD2}$ 152 may be +5.0 V and the second negative supply voltage $V_{SS2}$ 154 may be 0 V. The threshold voltage that differentiates between a high and low signal for the second voltage island 140 operating within the second voltage range $\Delta V_2$ 150 between $V_{DD2}$ 152 at +5.0 V and $V_{SS2}$ 154 at 0 V (e.g., a threshold of 2.5 v) may exceed the first positive supply voltage $V_{DD1}$ 122 of +1.0 V. As a result, the second voltage island 140 may be unable to correctly interpret a high data value represented by the signal 130 without level translators.

However, upon substantially equating the midpoint voltages 126 and 156, when the signal 130 represents a high data value, the value of the signal 130 may exceed the threshold voltage of the second voltage island 140. Thus, the signal 130 may be correctly interpreted by the second voltage island 140 as representing a high data value.

The voltage ranges $\Delta V_1$ 120 and $\Delta V_2$ 150 may be substantially equated to a convenient or desired common midpoint voltage. For example, if the convenient or desired common midpoint voltage is 0 v, the positive supply voltages 122 and 152 and the negative supply voltages 124 and 154 may be evenly centered around 0 v, as given by Eqs. (1)-(4) where "CMP" is the common midpoint voltage:

$$V_{DD1} = +\tfrac{1}{2}\Delta V_1 + CMP = \tfrac{1}{2}(V_{DD1} - V_{SS1}) + CMP \quad (1)$$

$$V_{SS1} = -\tfrac{1}{2}\Delta V_1 + CMP = \tfrac{1}{2}(V_{SS1} - V_{DD1}) + CMP \quad (2)$$

$$V_{DD2} = +\tfrac{1}{2}\Delta V_2 + CMP = \tfrac{1}{2}(V_{DD2} - V_{SS2}) + CMP \quad (3)$$

$$V_{SS2} = -\tfrac{1}{2}\Delta V_1 + CMP = \tfrac{1}{2}(V_{SS2} - V_{DD2}) + CMP \quad (4)$$

Solving Eqs. (1)-(4) for a common midpoint voltage of 0 V and in the example when the first voltage range $\Delta V_1$ 120 is 1.0 V and the second voltage range $\Delta V_2$ 150 is 5.0 V, the first positive supply voltage $V_{DD1}$ 122 may be +0.5 V and the first negative supply voltage $V_{SS1}$ 124 may be −0.5 V. The second positive supply voltage $V_{DD2}$ 152 may be +2.5 V and the second negative supply voltage $V_{SS2}$ 154 may be −2.5 V. As a further example, when the first voltage range $\Delta V_1$ 120 is 1.0 V and the second voltage range $\Delta V_2$ 150 is 5.0 V and the desired common midpoint voltage is −2.0 V, the first positive supply voltage $V_{DD1}$ 122 would be −1.5 V and the first negative supply voltage $V_{SS1}$ 124 would be −2.5 V. The second positive supply voltage $V_{DD2}$ 152 would be +0.5 V and the second negative supply voltage $V_{SS2}$ 154 would be −4.5 V. The positive and negative supply voltages thus may be set for any voltage ranges and any convenient or desired common midpoint voltage.

Centering the voltage ranges 120 and 150 around a common midpoint voltage facilitates communication between the first voltage island 110 and the second voltage island 140. Consider the example where the first voltage range $\Delta V_1$ 120 is 1.0 V and the second voltage range $\Delta V_2$ 150 is 5.0 V, and where the voltage ranges 120 and 150 are centered around a common midpoint of 0 V. As derived with respect to Eqs. (1)-(4), the first positive supply voltage $V_{DD1}$ 122 may be +0.5 V, the first negative supply voltage $V_{SS1}$ 124 may be −0.5 V, the second positive supply voltage $V_{DD2}$ 152 may be +2.5 V, and the second negative supply voltage $V_{SS2}$ 154 may be −2.5 V. When the signal 130 output by the first voltage island 110 represents a high data value (e.g., logical "1"), the signal 130 is likely to be expressed as a positive voltage between the common midpoint of 0 V and the first positive supply voltage $V_{DD1}$ 122 of +0.5 V. Because the positive voltage of the signal 130 is likely to be closer to the second positive supply voltage $V_{DD2}$ 152 of +2.5 V than to the second negative supply voltage $V_{SS2}$ 154 of −2.5 V, the data value represented by the signal 130 is likely to exceed the threshold voltage of the second voltage island 140. Thus, the second voltage island 140 may correctly interpret the signal 130 as representing a high data value. Correspondingly, when the signal 130 output by the first voltage island 110 represents a low data value (e.g., logical "0"), the signal 130 is likely to be expressed as a negative voltage between 0 V and the first negative supply voltage $V_{SS1}$ 124 of −0.5 V. Because the negative voltage of the signal 130 is likely to be closer to the second negative supply voltage $V_{SS2}$ 154 of −2.5 V than to the second positive supply voltage $V_{DD2}$ 152 of +2.5 V, the data value represented by the signal 130 is likely to be less than the threshold voltage of the second voltage island 140. Thus, the second voltage island 140 may correctly interpret the signal 130 as representing a low data value.

Figure 2:
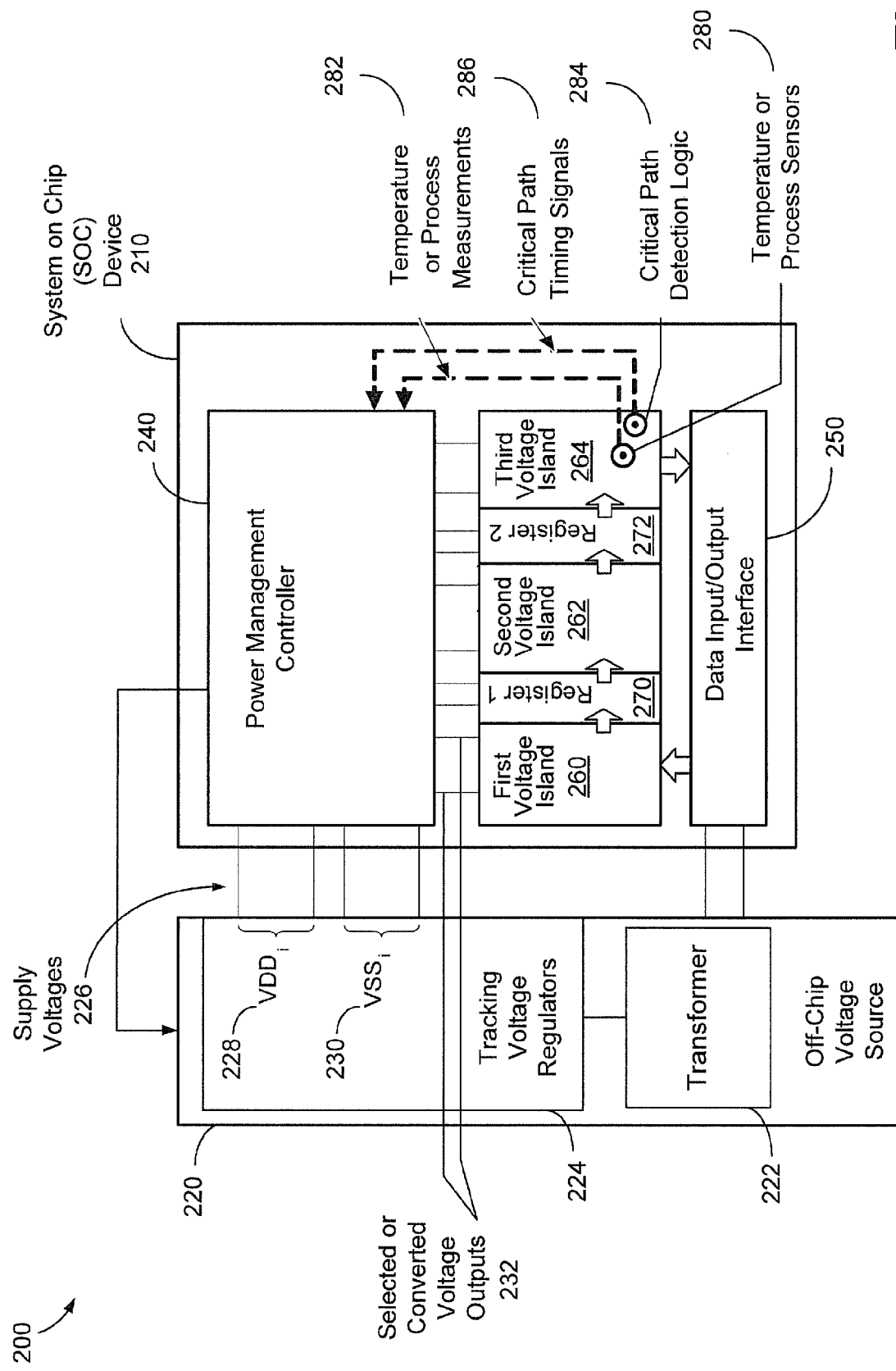
FIG. 2 is a block diagram of a system including a system on chip (SOC) device with a power management controller that selectively controls the voltage range within which voltage islands operate and facilitates communication between the voltage islands.

FIG. 2 is a block diagram of a system 200 including a system on chip (SOC) device 210 with a power management controller 240 that selectively controls the voltage ranges of voltage islands 260, 262, 264 and facilitates communication of signals between the voltage islands 260, 262, 264. The system 200 also includes a voltage source 220. The voltage source 220, as shown in FIG. 2, may be an off-chip voltage source that is external to the system on chip device 210. Alternatively, the voltage source 220 may be integrated within the system on chip device 210. The voltage source 220 includes a transformer 222 and tracking voltage regulators 224 that are used to provide a plurality of supply voltages 226 to the system on chip device 210.

In a particular illustrative embodiment, a plurality of positive supply voltages $V_{DDi}$ 228 and a plurality of negative supply voltages $V_{SSi}$ 230 may be provided to the power management controller 240 of the system on chip device 210. The power management controller 240 applies selected or converted voltage outputs 232 to the voltage islands 260, 262, 264, to registers 270, 272, and to other elements of the system on chip device 210. The power management controller 240 may convert voltages to lower or higher voltages as well as provide tracking regulation. For illustration, the embodiment of FIG. 2 includes three voltage islands 260, 262, 264 separated by two registers 270, 272, but embodiments may include any number of voltage islands separated by registers.

The supply voltages 226 supplied by the voltage source 220 also may provide one or more positive and negative supply voltages to a data input/output interface 250. The data input/output interface 250 may communicate with other systems that operate within different voltage ranges than the voltage ranges in which the voltage islands 260, 262, 264 of the system on chip device 210 operate. The voltages supplied to the data input/output interface 250 may be centered around a common midpoint in a similar manner as the other voltages supplied to the system on chip device 210 if the external devices also receive voltages centered around the common midpoint. Conversely, if the external devices receive, for example, relatively common positive and negative supply voltages of +5.0 V and 0 V, the voltage source 220 may provide positive and negative supply voltages of +5.0 V and 0 V to the data input/output interface 250 even when the other supply voltages provided to the system-on-chip device 210 are centered around a common midpoint voltage whether the common midpoint voltage is 0 V or whether the common midpoint voltage has a positive or negative non-zero voltage.

The power management controller 240 receives the supply voltages 226 from the voltage source 220 and selectively applies the supply voltages 226 to the voltage islands 260, 262, 264 to balance considerations such as performance, heat generation, and power consumption. As previously noted, the power management controller 240 may also accommodate on-chip voltage sources instead of receiving power from an off-chip voltage source, such as the voltage source 220. The power management controller 240 monitors input signals, such as temperature or process measurements 282 and critical path timing signals 286 that represent performance or operating conditions of the voltage islands 260, 262, 264. The information provided by the temperature or process measurements 282 and critical path timing signals 286 is used in selectively supplying power to each of the voltage islands 260, 262, 264.

The voltage islands 260, 262, 264 and registers 270, 272 are used to perform a series of processing operations on data received from the data input/output interface 250. After a first voltage island 260 receives input data from the data input/output interface 250 and processes the input data, an output of the first voltage island 260 may be stored by a first register 270 and passed to a second voltage island 262. After the second voltage island 262 processes the data received via the first register 270, the second voltage island 262 processes the data and an output of the second voltage island 262 is stored by a second register 272 and passed to a third voltage island 264. (As described with reference to FIG. 6, the registers 270, 272 may each include one or more latches or edge-triggered flip-flops.) An output of the third voltage island 264 is received by the data input/output interface 250 and may be supplied to another system or subsystem (not shown in FIG. 2). The registers 270, 272 may store or buffer the signals passed between the voltage islands 260, 262, 264, such as when the voltage islands include asynchronous processing devices. Alternatively, according to an additional illustrative embodiment described with reference to FIGS. 6-8, the registers 270, 272 may translate voltages of the signals passed between the voltage islands 260, 262, 264.

Operation of the voltage islands 260, 262, 264 is monitored by the power management controller 240. The power management controller 240 receives one or more input signals, such as temperature or process measurements 282 and critical path timing signals 286 that reflect the processing status or condition of the voltage islands 260, 262, 264. In response to the temperature or process measurements 282 and critical path timing signals 286, the power management controller 240 may determine whether more power should be supplied to one or more of the voltage islands 260, 262, 264 to increase processing performance. The power management controller 240 also may reduce power to one or more of the voltage islands 260, 262, 264 if processing is proceeding faster than necessary. The power management controller 240 also may reduce power to one or more of the voltage islands 260, 262, 264 if operating temperatures of one or more of the voltage islands 260, 262, 264 indicate that the voltage islands are operating at an excessive temperature or may be consuming excessive quantities of power.

Temperature or process sensors 280 may be associated with one or more of the voltage islands 260, 262, 264 to monitor an operating temperature or other indicia of operating speed (e.g., one or more completion signals) to gauge the operating speed of the voltage islands 260, 262, 264. The temperature or process measurements 282 may be communicated from the temperature or process sensors 280 to the power management controller 240. The temperature or process measurements 282 may convey temperature measurements that may be used to determine if one or more of the voltage islands 260, 262, 264 are operating at acceptable or excessive temperatures or to adjust voltages to maintain temperature-sensitive timing margins. The temperature or process measurements 282 also may include an offset to correct for timing variations that may occur in one or more of the voltage islands 260, 262, 264 as a result of fabrication process variability. Critical path detection logic 284 also may be used to monitor whether significant processing tasks have been completed or to measure timing slack (i.e., a length of time between completion of a computation and latching the result with the clock) in one or more of the voltage islands 260, 262, 264 and to indicate whether power supplied to any of the voltage islands 260, 262, 264, or at intermediate points within these islands, should be increased or decreased. Critical path timing signals 286 are relayed by the critical path detection logic 284 to the power management controller 240. The critical path timing signals 286 are used alone or in combination with the temperature and process measurements 282 to govern the supply of power to the voltage islands 260, 262, 264.

As described with reference to the supply voltages 226 provided by the voltage source 220, the positive supply voltages $V_{DDi}$ 228 and the negative supply voltages $V_{SSi}$ 230 selectively supplied to the voltage islands 260, 262, 264 are centered around a common midpoint. Thus, even if, for example, the first voltage island 260 is operating at relatively low positive-to-negative supply voltage differential and the second voltage island 262 is operating at higher positive-to-negative supply voltage differential, the second voltage island 262 may be able to correctly interpret the signals presented by the first voltage island 260 directly or, potentially, via the first register 270. Using the common midpoint, the second voltage island 262 may not misinterpret a high signal generated by the first voltage island 260 as a low signal just because the supply voltages of the second voltage island 262 have a greater range than the supply voltages of the first voltage island 260. Further, when the third voltage island 264 is operating at lower positive and negative supply voltages, the third voltage island 264 will be able to correctly interpret the signals presented by the second voltage island 262 directly or via the second register 272. Using the common midpoint, the third voltage island 264 may correctly interpret a low signal generated by the second voltage island 262 (i.e., the third voltage island 264 may not incorrectly interpret the low signal generated by the second voltage island 262 as a high signal).

Figure 3:
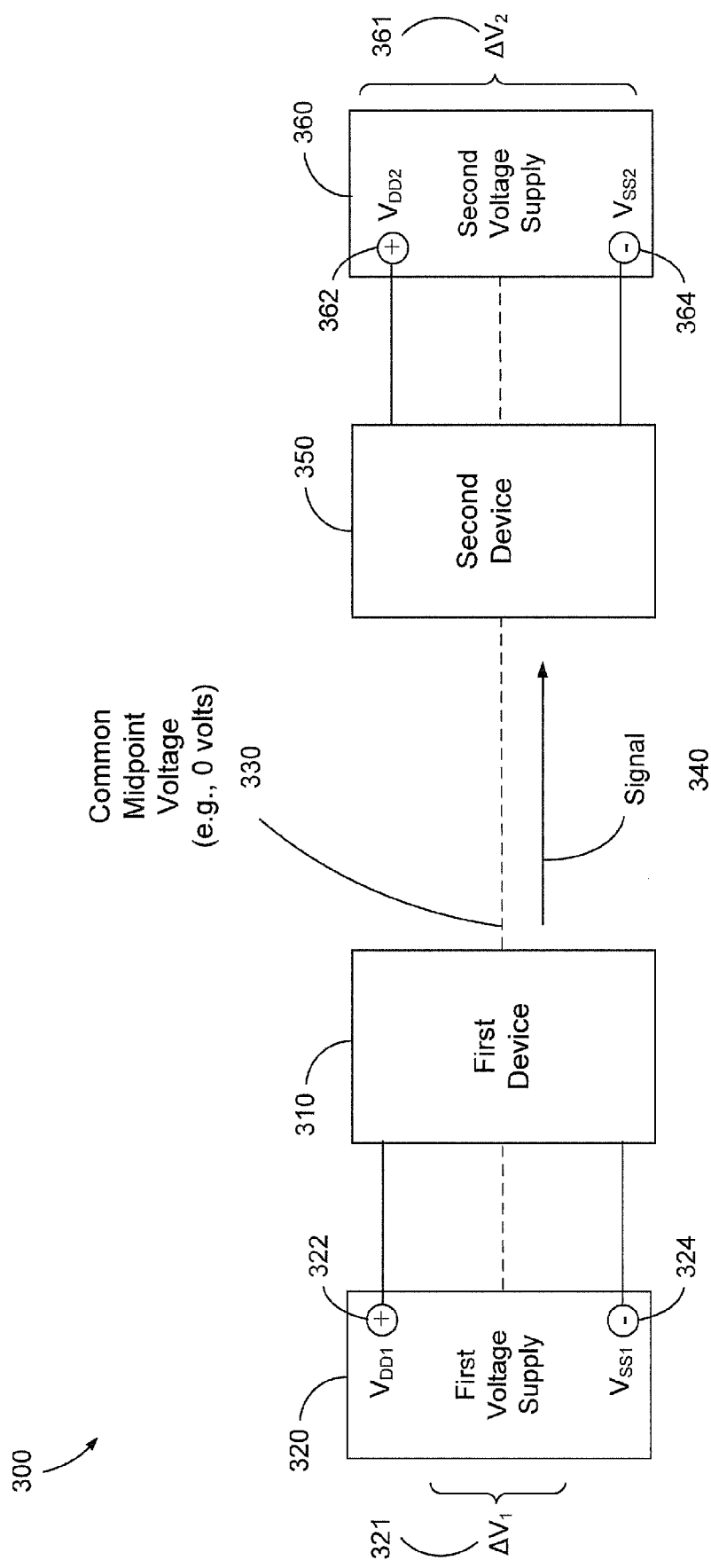
FIG. 3 is a block diagram of a system including a first device operating within a first voltage range and a second device operating within a second voltage range where the first voltage range and the second voltage range are centered around a common midpoint.

FIG. 3 is a block diagram of a system 300 including a first device 310 operating within a first voltage range 321 provided by a first voltage supply 320 and a second device 350 operating within a second voltage range 361 provided by a second voltage supply 360 where the first voltage range 321 and the second voltage range 361 are centered around a common midpoint voltage 330. At least one of the first voltage supply 320 and the second voltage supply 360 is configured to change voltage supply levels. The first voltage supply 320 may be configured to change the first positive supply voltage $V_{DD1}$ 322 and the first negative supply voltage $V_{SS1}$ 324 around the common midpoint voltage 330 used as a first midpoint voltage of the first device 310. The second voltage supply 360 may be configured to change the second positive supply voltage $V_{DD2}$ 362 and the second negative supply voltage $V_{SS2}$ 364 around the common midpoint voltage 330 used as a second midpoint voltage of the second device 350.

The first device 310 and the second device 350 may each include separate physical devices, and each of the devices 310 and 350 may include one or more circuit elements (not shown in FIG. 3). The first voltage range 321 between a first positive supply voltage $V_{DD1}$ 322 and a first negative supply voltage $V_{SS1}$ 324 and the second voltage range 361 between a second positive supply voltage $V_{DD2}$ 362 and a first negative supply voltage $V_{SS2}$ 364 are centered around the common midpoint voltage 330. A threshold voltage against which a data value represented by a signal 340 may be interpreted within both voltage ranges 321 and 361. Thus, assuming the threshold voltage is relatively closer to the common midpoint voltage 330 than to the second positive supply voltage 362 or the second negative supply voltage 364, the data value carried by the signal 340 generated by the first device 310 may be correctly interpreted by the second device 350.

FIG. 4 is a diagram representing a multiple-tapped transformer 400, such as the transformer 222 of FIG. 2, from which a range of positive and negative supply voltages may be drawn around a common midpoint. To draw first voltages $+V_1$ 420 and $-V_1$ 422 and second voltages $+V_2$ 430 and $-V_2$ 432 that are centered around a common midpoint 410, the transformer 400 is tapped at symmetrical winding points about the common midpoint 410. By tapping the transformer 400 at the symmetrical winding points at a substantially equal number of windings away from the common midpoint 410, the first voltages $+V_1$ 420 and $-V_1$ 422 and second voltages $+V_2$ 430 and $-V_2$ 432 may be centered around a common midpoint 410.

FIG. 5 is a schematic diagram of a field effect transistor (FET) rectifier 500 used in voltage regulators such as the tracking voltage regulators 224 of FIG. 2. An alternating current supply is received at input terminals 510 and 520 and the FET rectifier 500 generates a rectified, direct current at output terminals 530 and 540. The FET rectifier 500 uses a plurality of field effect transistors 560 along with a plurality of diodes 550 to provide a rectified direct current voltage supply at the output terminals 530 and 540. The FET rectifier 500 will operate at a range of midpoint voltages, such as the common midpoint of 0 V or a non-zero common midpoint voltage. The FET rectifier 500 is one example of a tracking voltage supply that may be included, for example, in the tracking voltage regulators 224 in the voltage source 220 of FIG. 2. The FET rectifier 500 is configured to supply a rectified voltage drawn from at least one pair of a plurality of symmetrical winding taps of a transformer, such as the multiple-tapped transformer 400 of FIG. 4.

Figure 6:
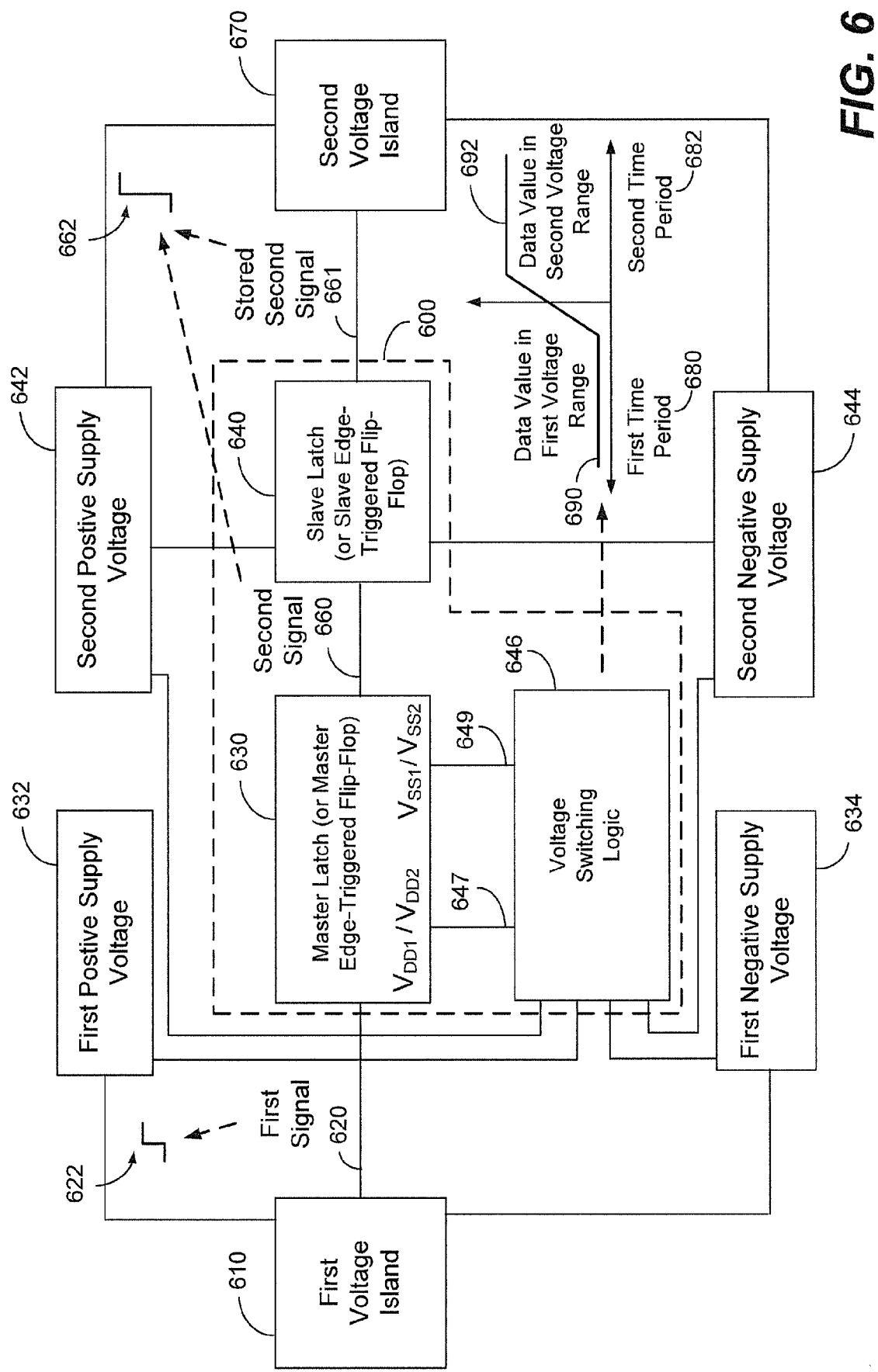
FIG. 6 is a block diagram of a register subsystem, including a master register to receive a signal from a first device operating within a first voltage range and an optional slave register to translate the signal from the first voltage range to a second voltage range.

FIG. 6 is a block diagram of a register subsystem 600, including a master latch or master edge-triggered flip-flop 630 to receive a first signal 620 from a first voltage island 610 operating within a first voltage range to translate the first signal 620 from the first voltage range to a second signal 660 in a second voltage range. In the particular illustrative embodiment of FIG. 6, the register subsystem 600 also includes a slave latch or slave edge-triggered flip-flop 640 that receives the second signal 660 and presents the stored second signal 661 (derived from the second signal) to the second voltage island 670. However, the register subsystem 600 may be implemented using only a single latch or edge-triggered flip flop positioned as the master latch or master edge-triggered flip-flop 630. For purposes of verbal simplicity, the master latch or master edge-triggered flip-flop 630 and the slave latch or slave edge-triggered flip-flop 640 will be referred to as the master latch 630 and the slave latch 640, respectively, for the rest of the description of FIG. 6.

The first voltage island 610 is coupled to a first positive supply voltage 632 and a first negative supply voltage 634. The second voltage island 670 is coupled to a second positive supply voltage 642 and a second negative supply voltage 644. Voltage switching logic 646 is coupled both to the first positive supply voltage 632 and the first negative supply voltage 634 and to the second positive supply voltage 642 and the second negative supply voltage 644. The master latch 630 (or, in a single latch or single edge-triggered flip-flop embodiment, the only latch) receives a positive supply voltage 647 that is either $V_{DD1}$ or $V_{DD2}$ ($V_{DD1}/V_{DD2}$) and a negative supply voltage 649 that is either $V_{SS1}$ or $V_{SS2}$ ($V_{SS1}/V_{SS2}$). The voltage switching logic 646 selectively supplies either $V_{DD1}$ or $V_{DD2}$ and either $V_{SS1}$ or $V_{SS2}$ as the positive supply voltage 647 and the negative supply voltage 649, respectively. The slave latch 640, when used, is coupled to a second positive supply voltage 642 and a second negative supply voltage 644.

The master latch 630 receives the first signal 620 from the first voltage island 610 operating within a first voltage range between a first positive voltage supply 632 and a first negative voltage supply 634. The master latch 630 stores a data value represented by the first signal 620. When the first positive supply voltage 632 and the first negative supply voltage 634 determine the ends of a relatively small voltage range, the first signal 620 may have a relatively small voltage swing 622 between low and high data values, as previously described. The master latch 630 presents a second signal 660 which, as further described below, may have a relatively large voltage swing 662 between low and high data values to facilitate the second signal 660 being read by the second voltage island 670, as also previously described. The slave latch 640 receives the second signal 660 presented by the master latch 630 and stores the data value represented. The output of the slave latch 640 is a stored second signal 661 that corresponds to the voltage swing 662 of the second signal 660 received from the master latch 630. The stored second signal 661 is presented to the second voltage island 670.

To translate the first signal 620 so that the second signal 660 passed to and stored by the slave latch 640 (or passed directly to the second voltage island 670 in a single latch embodiment) represents the same data value as the first signal 620, the voltage switching logic causes the master latch 630 to change operating voltages. To translate the first signal 620, the master latch 630 receives the first signal 620 while operating within the first voltage range between the first positive supply voltage 632 and the first negative supply voltage 634 provided to the master latch 630 by the voltage switching logic 646 as the positive supply voltage 647 and the negative supply voltage 649, respectively. After the data value of the first signal is stored in the master latch 630, the voltage switching logic 646 changes the positive supply voltage 647 and the negative supply voltage 649 to the second positive supply voltage 642 and the second negative supply voltage 644, respectively. While operating in the larger voltage range between the second positive supply voltage 642 and the second negative supply voltage 644, the output of the master latch 630 is the second signal 660 which is presented over the larger voltage swing 662 between low and high data values. The second signal 660 output by the master latch 630 (and presented to the second voltage island 670 by the slave latch 640 when the slave latch 640 is used) may then represent the same data value as represented by the first signal 620 in the second voltage range within which a second voltage island 670 operates.

The voltage ranges within which one or more of the voltage islands 610 and 670 and the latches 630 and 640 operate may be predetermined or may be controlled by an external device, such as the power management controller 240 of FIG. 2.

As a result, a data value in the first voltage range 690 stored in the master latch 630 during a first time period 680 may be translated to a different voltage to represent the data value in the second voltage range 692 during a second time period 682. The time periods 680, 682 may be adjacent or non-adjacent periods of a clock signal (not shown in FIG. 6) used to clock one or more devices, such as the master latch 630 and the slave latch 640.

By translating the data value represented by a first voltage in the first voltage range 690 to the data value represented by a second voltage in the second voltage range 692, regardless of whether the data value is a low data value, a high data value, or a non-binary data value relative to a voltage range, the data value represented by the second signal 660 (and the stored second signal 661 when the slave latch 640 is used) may be correctly interpreted by the second voltage island 670 as the same data value represented by the first signal 620 of the first voltage island 610.

The latch subsystem translates the data value represented by a first voltage in the first voltage range 690 to the data value represented by a second value in the second voltage domain without certain limitations of conventional voltage translators. For example, the translation of the first signal 620 to the second signal 660 does not involve the use of an amplifier, thereby saving the power that may have been consumed by an amplifier. Further, the latch subsystem 600 may operate synchronously with a clock signal (not shown in FIG. 6). Thus, operations performed at the second voltage island 670 on the second signal 660 may not have the latency due to a voltage translator.

Using both a master latch 630 and a slave latch 640 may improve performance. For example, the master latch 630 may be receiving and translating a subsequent first signal 620 based on a subsequent data value generated by the first voltage island 610 at the same time the slave latch 640 is presenting the stored second signal 661, based on the previous second signal 660). Alternatively, the master latch 630 may be a single latch that receives the first signal 620, translates the first signal 620 to the second signal 660, and presents the second signal directly to the second voltage island 670.

In the foregoing example, the signal voltage generated by the first voltage island 610 is being translated from a relatively small voltage range determined by the first positive supply voltage 632 and the first negative supply voltage 634 to a larger voltage range between the second positive supply voltage 642 and the second negative supply voltage 644. Thus, the first signal 620 has a relatively small voltage swing 622 between low and high data values as compared to the second signal 660 which has a larger voltage swing 662 between low and high data values. This translation may be helpful when the second voltage island 670 or another receiving device has a midpoint voltage that is greater than the high voltage of the preceding system so that a high data value signal from the first voltage island 610 is not misread as a low data value signal by the second voltage island 670. As previously described, however, when the first voltage island 610 and the second voltage island 670 operate within voltage ranges that are centered around a common midpoint, using registers between the voltage islands 610, 670 to translate the data value signals may not be needed. Particularly when the first voltage island 610 operates within a higher voltage range than the second voltage island 670 (i.e., the opposite of the previously described example) and the voltage ranges are centered around a common midpoint, a low data value signal generated by the first voltage island 610 is likely to be below the threshold voltage of the second voltage island 670 without using registers for voltage translation.

Figure 7A:
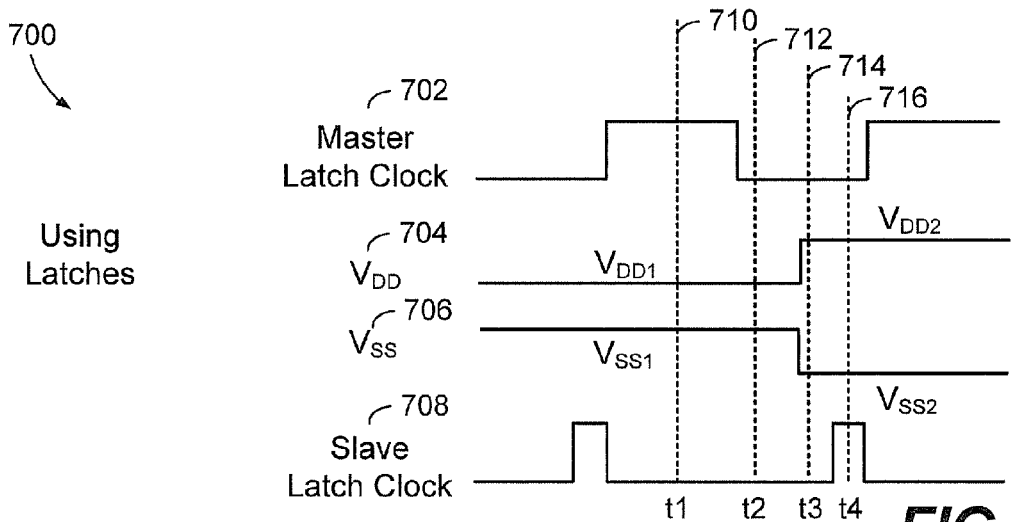
FIGS. 7A-7C are timing diagrams representing how signals may be translated using different types of latch or flip-combinations as registers between voltage islands.
Figure 7B:
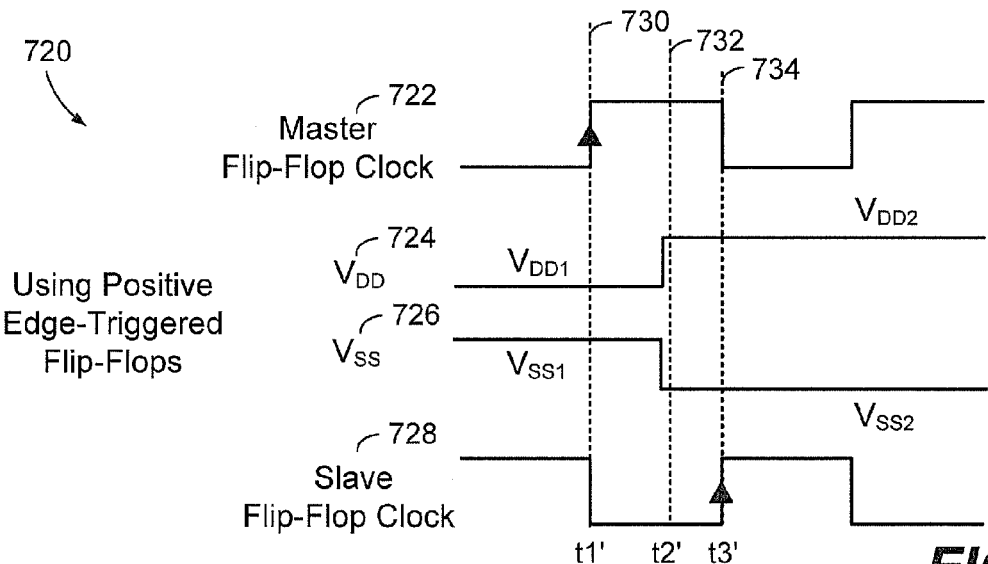
Figure 7C:
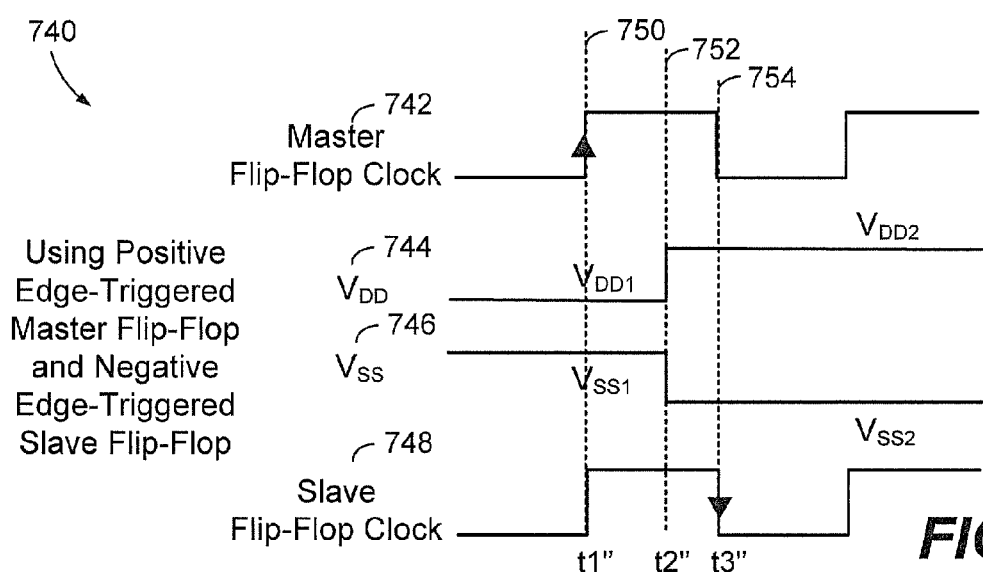

FIGS. 7A-7C are timing diagrams 700, 720, 740 representing how signals may be translated using different types of latch or flip-combinations as registers between voltage islands, such as the first voltage island 610 and the second voltage island 670 (FIG. 6).

Referring to FIG. 7A, a first timing diagram 700 represents an implementation using latches. A master latch clock signal 702 clocks a master latch, such as the master latch 630, and a slave latch clock signal 708 clocks a slave latch, such as the slave latch 640. The master latch stores a received signal when the master latch clock signal 702 is at a high level, such as at time t1 710. After the master latch clock signal 702 is at a low level, such as at time t2 712, the value of the data signal is stored in the master latch. At time t3 714, the positive supply voltage $V_{DD}$ 704 and the negative supply voltage $V_{SS}$ 706 transition to new levels, defining a wider voltage swing as shown in FIG. 7A.

The supply voltages $V_{DD}$ 704 and $V_{SS}$ 706 transition while the same data value is stored in the master latch, so the data value remains the same but the data value will be output according to a larger voltage swing proportional to the higher voltage range defined by the changed supply voltages $V_{DD}$ 704 and $V_{SS}$ 706 after time t3 714. At time t4 716, the slave latch clock signal 708 is at a high level, causing the slave latch to store the data value presented by the output signal of the master latch. Because of the translation of the signal representing the data value to the higher voltage range at which the slave latch operates (as described with reference to FIG. 6), the slave latch may be better able to accurately read the data value presented by the master latch. The slave latch then presents the stored data value to another voltage island operating within the same voltage range as the slave latch, as described with reference to FIG. 6.

Referring to FIG. 7B, a second timing diagram 720 represents an implementation using positive edge-triggered flip-flops as the registers between voltage islands. A master flip-flop clock signal 722 clocks a master positive edge-triggered flip-flop, such as the master edge-triggered flip-flop 630, and a slave flip-flop clock signal 728 clocks a slave latch, such as the slave edge-triggered flip-flop latch 640. (Note that, by using a negative edge-triggered slave flip-flop, the slave flip-flop clock signal 748 may be an inverse of the master flip-flop clock signal 722 and thus a single clock source and an inverter may provide both the master flip-flop clock signal 722 and the slave flip-flop clock signal 728.) The master flip-flop stores a received signal when the master flip-flop clock signal 722 transitions to a high level, such as at time t1' 730 (i.e., at a positive edge).

While the master flip-flop clock signal 722 remains at a high level (or at least before another positive edge at a transition to a high level), such as at time t2' 732, while the value of the data signal remains stored in the master latch, a positive supply voltage $V_{DD}$ 724 and a negative supply voltage $V_{SS}$ 726 transition to new levels, defining a wider voltage swing as shown in FIG. 7B. The supply voltages $V_{DD}$ 724 and $V_{SS}$ 726 transition while the same data value is stored in the master latch, so the data value remains the same but the data value will be output according to a larger voltage swing proportional to the higher voltage range defined by the changed supply voltages $V_{DD}$ 724 and $V_{SS}$ 726 after time t2' 732. At time t3' 734, the slave latch clock signal 728 transitions to a high level (i.e., at a positive edge), causing the slave latch to store the data value presented by the output signal of the master latch. Because of the translation of the signal representing the data value to the higher voltage range at which the slave latch operates, the slave latch may be better able to accurately read the data value presented by the master latch. The slave latch then presents the stored data value to another voltage island operating within the same voltage range as the slave latch.

Referring to FIG. 7C, a third timing diagram 740 represents an implementation using a positive edge-triggered master flip-flop and a negative edge-triggered flip-flop as the registers between voltage islands. A master flip-flop clock signal 742 clocks a master positive edge-triggered flip-flop, such as the master edge-triggered flip-flop 630, and a slave flip-flop clock signal 748 clocks a slave latch, such as the slave edge-triggered flip-flop latch 640. (Note that, by using a negative edge-triggered slave flip-flop, the master flip-flop clock signal 742 and the slave flip-flop clock signal 748 may be the same signal generated by a single clock source.) The master flip-flop stores a received signal when the master flip-flop clock signal 742 transitions to a high level (i.e., at a positive edge), such as at time t1" 750.

While the master flip-flop clock signal 742 remains at a high level (or at least before another positive edge at a transition to a high level), such as at time t3" 754, while the value of the data signal remains stored in the master latch, a positive supply voltage $V_{DD}$ 744 and a negative supply voltage $V_{SS}$ 746 transition to new levels, defining a wider voltage swing as shown in FIG. 7C. The supply voltages $V_{DD}$ 744 and $V_{SS}$ 746 transition while the same data value is stored in the master latch, so the data value remains the same but the data value will be output according to a larger voltage swing proportional to the higher voltage range defined by the changed supply voltages $V_{DD}$ 744 and $V_{SS}$ 746 after time t2" 752. At time t3" 754, the slave latch clock signal 748 transitions to a low level (i.e., at a negative edge), causing the slave latch to store the data value presented by the output signal of the master latch. Because of the translation of the signal representing the data value to the higher voltage range at which the slave latch operates, the slave latch may be better able to accurately read the data value presented by the master latch. The slave latch then presents the stored data value to another voltage island operating within the same voltage range as the slave latch.

Figure 8:
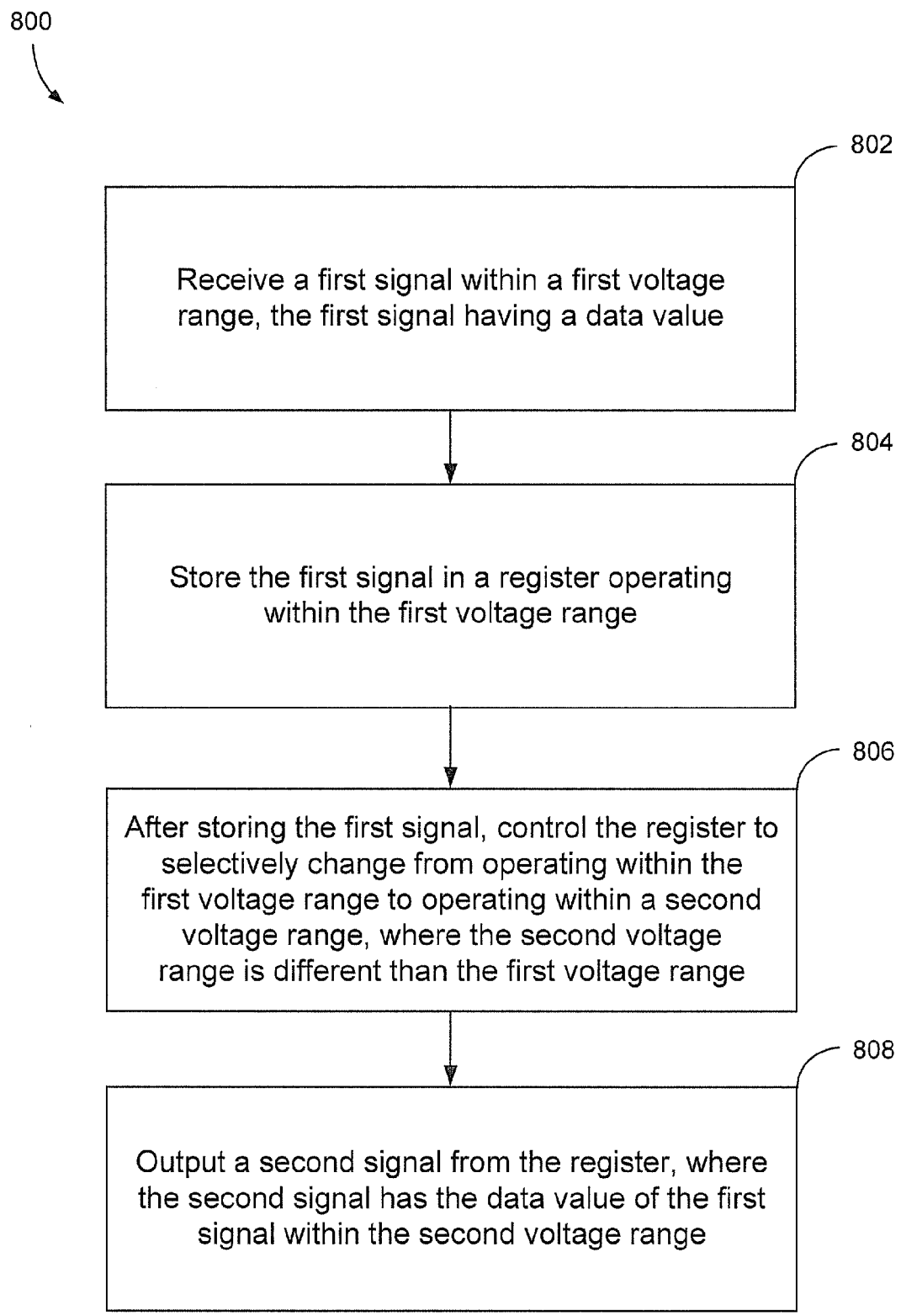
FIG. 8 is a flow diagram of a particular embodiment of a method of controlling a register to translate a first signal representing a data value in a first voltage range to a second signal representing the data value in a second voltage range.

FIG. 8 is a flow diagram of a particular embodiment of a method 800 of controlling a latch to translate a first signal representing a data value in a first voltage range to a second signal representing the data value in a second voltage range. The first signal within the first voltage range is received, at 802. The first signal may include the first signal 620 as received by the master latch 630 of FIG. 6. The first signal represents a data value (e.g., logic "0" or logic "1"). The first signal is stored in a latch operating within the first voltage range, at 804, such as the master latch 630 or a single latch operating using the first positive supply voltage 632 and the first negative supply voltage 634 of FIG. 6. After completing storing 804 of the first signal, the latch is controlled to selectively change from operating within the first voltage range to operating within a second voltage range, at 806. For example, after the master latch 630 of FIG. 6 (or a single latch) stores the first signal representing the data value, the voltage switching logic 646 controls the master latch 630 (or a single latch) to cause the master latch 630 (or a single latch) to receive the second positive supply voltage 642 and the second negative supply voltage 644 to operate in a second voltage range. The second voltage range is different than the first voltage range. A second signal is output from the latch, at 808. The second signal output from the latch is comparable to the second signal 661 of FIG. 6 output by the slave latch 640. The second signal represents the data value of the first signal within the second voltage range. The second signal, like the second signal 660 may be received and stored by the slave latch 640 of FIG. 6 and presented to the second voltage island 670 as the stored second signal 661. Alternatively, the second signal may be presented directly to the second voltage island 670 of FIG. 6 without using a slave latch.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. For example, method steps may be performed in a different order than is shown in the figures or one or more method steps may be omitted. Accordingly, the disclosure and the figures are to be regarded as illustrative rather than restrictive.

Moreover, although specific embodiments have been illustrated and described herein, it should be appreciated that any subsequent arrangement designed to achieve the same or similar results may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

The Abstract of the Disclosure is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, the claimed subject matter may be directed to less than all of the features of any of the disclosed embodiments.

What is claimed is:

1. A semiconductor device comprising:
    a first voltage island configured to operate within a first voltage range, wherein the first voltage range has a first midpoint, and wherein the first voltage range is provided in part by a voltage source that includes a tracking voltage regulator; and
    a second voltage island configured to operate within a second voltage range, wherein the second voltage range has a second midpoint,
    wherein:
        the first voltage range is different than the second voltage range; and
        the first midpoint is substantially equal to the second midpoint.

2. The semiconductor device of claim 1, wherein the first midpoint and the second midpoint are substantially equal to zero volts (0 V).

3. The semiconductor device of claim 1, further comprising a power management controller, wherein the power management controller is configured to selectively control at least one of the first voltage range and the second voltage range.

4. The semiconductor device of claim 3, wherein the power management controller receives an input signal from at least one of the first voltage island and the second voltage island, and wherein the power management controller selectively controls a voltage level of at least one of the first voltage range and the second voltage range in response to the input signal.

5. The semiconductor device of claim 4, wherein the input signal includes at least one of:
    a temperature measurement of an operating temperature of at least one of the first voltage island and the second voltage island;
    a process measurement including an offset to correct for timing variations that may occur in at least one of the first voltage island and the second voltage island as a result of fabrication process variability; or
    a critical path timing signal, wherein the critical timing signal is generated by critical path logic configured to determine an amount of slack time between completion of a computation and storing a result with a clock.

6. The semiconductor device of claim 1, wherein the first voltage range and the second voltage range are provided by a plurality of voltage sources including at least one of:
    on-chip voltage sources; or
    off-chip voltage sources.

7. The semiconductor device of claim 6, wherein the plurality of voltage sources includes the voltage source that includes the tracking voltage regulator.

8. The semiconductor device of claim 1, wherein the tracking voltage regulator includes a field effect transistor (FET) rectifier.

9. The semiconductor device of claim 6, wherein at least one of the plurality of voltage sources is configured to supply a rectified voltage drawn from a voltage drawn from at least one pair of a plurality of symmetrical winding taps of a transformer.

10. The semiconductor device of claim 1, further comprising:
    a register subsystem configured to store an output signal of the first voltage island; and
    voltage switching logic, wherein once the output signal is stored, the register is switched from operating at the first voltage range to operating at the second voltage range.

11. The semiconductor device of claim 1, wherein the first voltage island and the second voltage island are included in a system on chip (SOC) device.

12. A system comprising:
    a first device operating at a first voltage range between a first positive supply voltage and a first negative supply voltage, wherein the first voltage range is centered around a first voltage midpoint; and
    a second device operating at a second voltage range between a second positive supply voltage and a second negative supply voltage, wherein the second voltage range is centered around a second voltage midpoint,
    wherein:
        the first positive supply voltage is different than the second positive supply voltage;
        the first negative supply voltage is different than the second negative supply voltage;
        the first voltage range is different than the second voltage range; and
        the first voltage midpoint is substantially equal to the second voltage midpoint.

13. The system of claim 12, wherein the first midpoint voltage and the second midpoint voltage are approximately equal to zero volts (0v).

14. The system of claim 12, further comprising:
    a first voltage supply to provide the first positive supply voltage and the first negative supply voltage; and
    a second voltage supply to provide the second positive supply voltage and the second negative supply voltage.

15. The system of claim 14, wherein at least one of:
    the first voltage supply changes levels of the first positive supply voltage and the first negative supply voltage around the first midpoint voltage; and the second voltage supply changes levels of the second positive supply voltage and the second negative supply voltage around the second midpoint voltage.

16. A method comprising:
receiving a first signal within a first voltage range, the first signal representing a data value;
storing the first signal in a register operating within the first voltage range, wherein the register includes a latch or a flip-flop;
after storing the first signal, controlling the register to selectively change from operating within the first voltage range to operating within a second voltage range, wherein the second voltage range is different than the first voltage range; and
outputting a second signal from the register, wherein the second signal represents the data value of the first signal within the second voltage range.

17. The method of claim 16, wherein the data value is a low binary value or a high binary value.

18. The method of claim 16, wherein the first signal is received at a master register operating within the first voltage range.

19. The method of claim 18, wherein the second signal is provided from the master register to a slave register, and wherein the slave register is configured to store a value associated with the second signal.

20. The method of claim 16, wherein the register includes the flip-flop, and wherein the flip-flop comprises an edge-triggered flip-flop.

21. The semiconductor device of claim 1, wherein the first voltage range is established between a first supply value and a second supply value, and wherein a first difference between a value of the first midpoint and the first supply value is substantially equal to a second difference between the value of the first midpoint and the second supply value.

22. The semiconductor device of claim 1, further comprising a power management controller configured to selectively control a voltage level of the first voltage range based on an input signal received from one of the first voltage island or the second voltage island.

23. The semiconductor device of claim 22, wherein the input signal is received from the first voltage island.

24. The semiconductor device of claim 22, wherein the input signal is associated with one of a temperature measurement, a process offset measurement, or a critical path timing signal.

25. The system of claim 12, further comprising a controller to modify the first voltage range, wherein modifying the first voltage range includes changing a value of the first positive supply voltage and changing a value of the first negative supply voltage.

26. The system of claim 25, wherein the first voltage midpoint remains unchanged after the first voltage range is modified.

27. The method of claim 16, wherein the register includes a master register, and wherein the second signal is output from the register to a slave register configured to store a value associated with the second signal.

28. The semiconductor device of claim 1, wherein the first midpoint and the second midpoint are associated with a common midpoint of a transformer winding associated with the voltage source.

29. The semiconductor device of claim 1, wherein the first midpoint is equal to the second midpoint.

30. The semiconductor device of claim 1, further comprising a third voltage island configured to operate within a third voltage range, wherein the third voltage range has a third midpoint that is substantially equal to the first midpoint.

* * * * *